(12) United States Patent
Passerini et al.

(10) Patent No.: US 8,884,666 B2
(45) Date of Patent: Nov. 11, 2014

(54) CLOCK GENERATOR

(75) Inventors: Marco Passerini, Lozza (IT); Stefano Surico, Bussero (IT)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/196,394

(22) Filed: Aug. 2, 2011

(65) Prior Publication Data

US 2013/0033947 A1 Feb. 7, 2013

(51) Int. Cl.
*H03L 7/00* (2006.01)
*H03L 7/06* (2006.01)
*G11C 8/00* (2006.01)
*G06F 1/06* (2006.01)
*G11C 29/02* (2006.01)
*H03K 3/0231* (2006.01)
*G11C 7/22* (2006.01)

(52) U.S. Cl.
CPC .............. *G11C 29/028* (2013.01); *G06F 1/06* (2013.01); *G11C 29/023* (2013.01); *H03K 3/0231* (2013.01); *G11C 7/222* (2013.01)
USPC ........... 327/141; 327/142; 327/155; 327/156; 365/233.1; 365/233.11

(58) Field of Classification Search
USPC ....................... 327/141, 142, 155, 156; 331/2; 365/233.1, 233.11
See application file for complete search history.

(56) References Cited

U.S. PATENT DOCUMENTS

| | | | | |
|---|---|---|---|---|
| 3,769,607 A | * | 10/1973 | Thelen | ............... 331/2 |
| 4,282,493 A | * | 8/1981 | Moreau | .............. 331/2 |
| 4,868,514 A | * | 9/1989 | Azevedo et al. | .............. 327/155 |
| 5,448,193 A | * | 9/1995 | Baumert et al. | .............. 327/156 |
| 5,734,301 A | * | 3/1998 | Lee et al. | ........................ 331/2 |
| 6,052,035 A | | 4/2000 | Nolan et al. | |
| 6,118,314 A | * | 9/2000 | Arnould et al. | .............. 327/141 |
| 6,917,249 B1 | | 7/2005 | Kuo et al. | |
| 7,233,213 B2 | | 6/2007 | Won | |
| 7,701,802 B2 | | 4/2010 | Vergnes et al. | |
| 7,724,606 B2 | | 5/2010 | Osawa et al. | |
| 7,808,805 B2 | | 10/2010 | Ko | |
| 7,952,438 B2 | * | 5/2011 | Song et al. | ........................ 331/2 |
| 8,207,976 B2 | | 6/2012 | Hein | |
| 8,264,906 B2 | | 9/2012 | Chiu | |
| 8,362,848 B2 | * | 1/2013 | Raghunathan et al. | ........ 327/156 |
| 8,432,767 B2 | | 4/2013 | Gillingham et al. | |

* cited by examiner

*Primary Examiner* — Trong Phan

(57) ABSTRACT

Disclosed herein is a device comprising a first terminal for a first clock signal, a second terminal for a second clock signal substantially complementary to the first clock signal, a third terminal for a third clock signal, a fourth terminal for a fourth clock signal substantially complementary to the third clock signal, a first logic gate to produce a first intermediate signal, a second logic gate to produce a second intermediate signal, a first delay circuit to produce a third intermediate signal, and a second delay circuit to produce a fourth intermediate signal, and a first output circuit coupled to the first and second delay circuits to produce the third and fourth clock signals respectively at the third and fourth terminals.

22 Claims, 12 Drawing Sheets

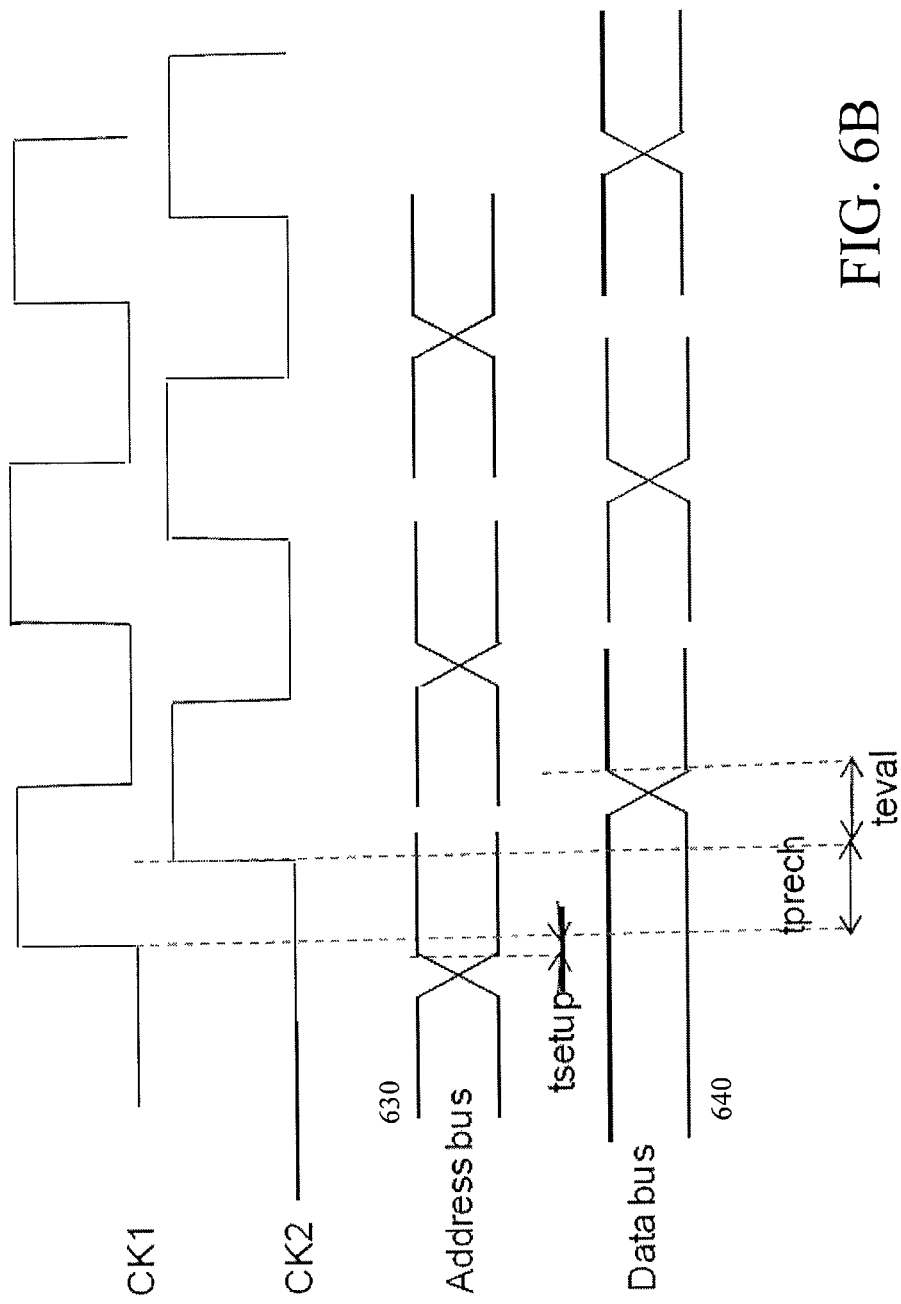

CLOCK GENERATOR

FIELD OF THE INVENTION

The present disclosure relates to a clock generator.

The disclosure particularly, but not exclusively, relates to a clock generator generating clock signals, and the following description is made with reference to this field of application for convenience of explanation only.

BACKGROUND OF THE INVENTION

In a general definition, clock signals are repetitive digital signals, i.e. they are voltage waves toggling from a low logic state "0" to a high logic state "1". The duty-cycle for these signals, being defined as the ratio between the time the signal is at logic state "1" over the repetition period or clock period, can be of any value between 0 and 1. In many practical applications, the duty-cycle is 0.5.

Clock signals are needed in electronic devices for a variety of different circuits, blocks, sub-systems or systems. Some examples include microprocessors or microcontrollers, DC-DC converters, switched capacitor filters and so on. In a limited number of cases, the clock period changes during time, for example with respect to different working phases of the corresponding device, while in the most common applications, the clock period is instead fixed and it does not vary over the time.

Moreover, for instance during a testing phase of an electronic device, it is often required to configure the clock period or clock phase among a range of possible values. Sometimes, it might be needed to finely adjust the clock period or clock phase to match a designed target. For example, it is sometimes needed to operate an electronic device at a different speed or to correct a clock period value or clock phase to compensate some fabrication process spread.

Digital oscillators or clock generators are electronic circuits used to generate digital clock signals. Amongst the different architectures of an oscillator, the ring oscillator is one of the most popular and simple.

An oscillator with temperature compensation and a clock output inhibition control is disclosed for instance in the U.S. Pat. No. 6,052,035.

In other cases, it may be also desirable to have different clock signals with a precise time difference between them. As an example, two signals with a time difference between their rising edge, same period and same duty cycle could be useful to generate different phase signals needed for a memory reading phase. For example, it may be a reading phase of a ROM or a RAM memory.

SUMMARY OF THE INVENTION

According to one aspect of the invention, there is provided a device that comprises a first terminal for a first clock signal, a second terminal for a second clock signal that is substantially complementary to the first clock signal, a third terminal for a third clock signal, a fourth terminal for a fourth clock signal that is substantially complementary to the third clock signal, a first logic gate performing a first logic operation on the first and third clock signals to produce a first intermediate signal, a second logic gate performing a second logic operation on the second and fourth clock signals to produce a second intermediate signal, a first delay circuit delaying the first intermediate signal to produce a third intermediate signal, a second delay circuit delaying the second intermediate signal to produce a fourth intermediate signal, and a first output circuit coupled to the first and second delay circuits to produce the third and fourth clock signals respectively at the third and fourth terminals.

It may be convenient to provide such a clock generator that generates the first and second clock signals and includes a third delay circuit delaying the first clock signal to produce a fifth intermediate signal, a fourth delay circuit delaying the second clock signal to produce a sixth intermediate signal, and a second output circuit coupled to the third and fourth delay circuits to produce the first and second clock signals respectively at the first and second terminals.

Another aspect of the invention provides a device comprising a first (or master) clock generator generating a first clock signal at first output terminal and a second clock signal at a second output terminal, the first clock signal being substantially complementary to the second clock signal, and a second (or slave) clock generator including a first input terminal coupled to the second output terminal, a second input terminal coupled to the first output terminal, a first feedback terminal, a second feedback terminal, a third output terminal coupled to the second feedback terminal, and a fourth output terminal coupled to the first feedback terminal, the second clock generator generating a third clock signal at the third output terminal and a fourth clock signal at the fourth output terminal, the third clock signal being substantially complementary to the fourth clock signal, the first and third clock signals being substantially equal in frequency to each other and differing in phase from each other by a first value that is smaller than a half of one cycle period of the first clock signal.

In addition to the first and second clock generator, a third clock generator as another slave clock generator may be provided in parallel to or in series to the second clock generator.

There is provided according to still another aspect of the invention a device that comprises a control unit, a memory unit, a bus interconnecting the memory unit and memory unit to each other, a first clock line coupled to the control unit and the memory unit to convey a first clock signal, a second clock line coupled to the memory unit to convey a second clock signal, and a clock generation circuit generating the first and second clock signals. The control unit accesses to the memory unit through the bus in response to the first clock signal, and the memory unit supplies data to the control unit through the bus in response to the second clock signal. The clock generation circuit includes a first (or master) and a second (or slave) clock generator. The first clock generator includes a first output terminal coupled to the first clock line to generate the first clock signal and a second output terminal from which a third clock signal is generated, the third clock signal being substantially complementary to the first clock signal. The second clock generator includes a first input terminal coupled to the second output terminal, a second input terminal coupled to the first output terminal, a first feedback terminal, a second feedback terminal, a third output terminal coupled to the second clock line and to the second feedback terminal, and a fourth output terminal coupled to the first feedback terminal, the second clock generator generating the second clock signal at the third output terminal and a fourth clock signal at the fourth output terminal, the fourth clock signal being substantially complementary to the second clock signal, the first and second clock signals being substantially equal in frequency to each other and differing in phase from each other by a first value that is smaller than a half of one cycle period of the first clock signal.

The clock generation circuit may be interconnected to the bus to receive configuration data from the control unit to vary or adjust the first value.

BRIEF DESCRIPTION OF THE DRAWINGS

The characteristics and advantages of the oscillator or clock generator according to the disclosure will be apparent from the following description of embodiments thereof given by way of indicative and non limiting example with reference to the annexed drawings, in which FIG. 1 schematically illustrates a block diagram of an oscillator or clock generator according to an embodiment of the disclosure.

FIG. 6B schematically shows a time diagram relating to the memory architecture of FIG. 6A.

DETAILED DESCRIPTION OF THE EMBODIMENTS

While the preferred embodiments according to the invention will described in detail below, the terms "master" and "slave" are used throughout the specification and claims merely to distinguish two clock signals and generators, each clock signal having a different phase from the other and a slave clock generator being provided with the output signal of a master clock generator to generate an output clock signal. These terms should not be interpreted in a way to limit the function of each clock generator or each clock generator's output signal. For example, the master clock signal is not necessarily provided to a so-called master circuit element, and the slave clock signal is not necessarily provided to a so-called slave circuit element which has a master-slave relationship with the master circuit element. Since the term "oscillator" and "clock generator" have an equivalent meaning, those will be used interchangeably throughout the whole specification.

Figure 1:
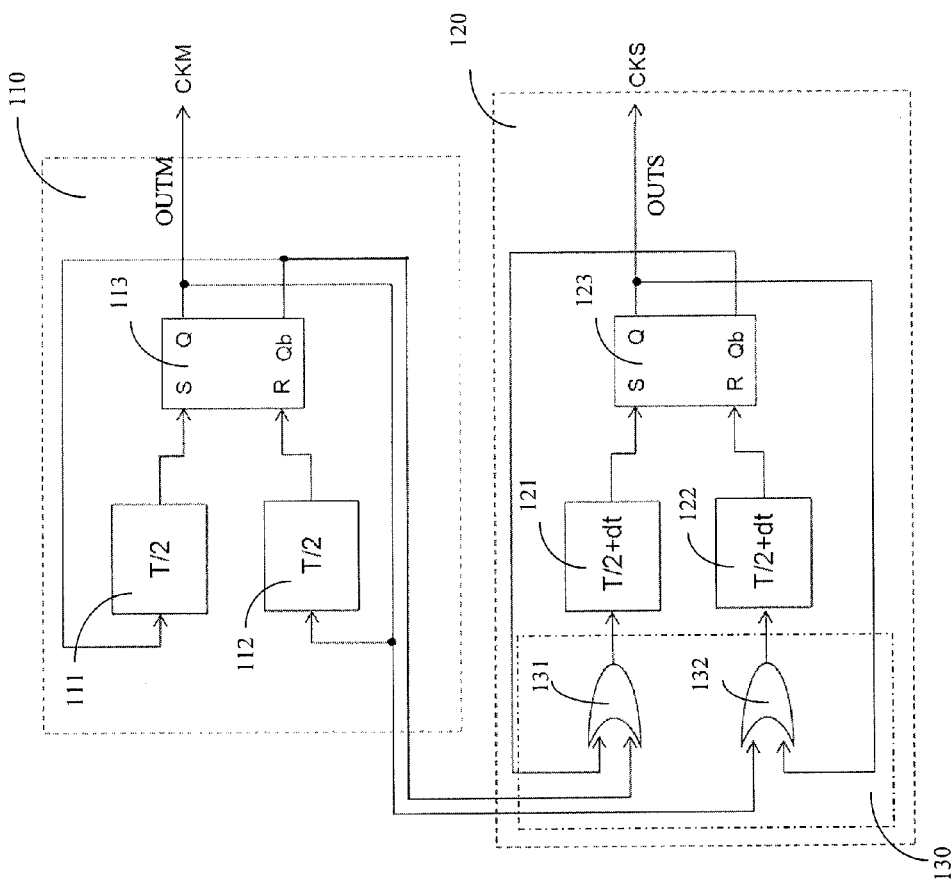

FIG. 1 schematically illustrates a block diagram of an oscillator or clock generator according to an embodiment of the invention.

According to this embodiment, the clock generator 100 comprises at least a master oscillator 110 and a slave oscillator 120. Of course, the clock generator 100 may comprise a plurality of slave oscillators, connected to the master oscillator, in cascade or in parallel one another. In FIG. 1, only one slave oscillator 120 is shown for sake of simplicity.

The master oscillator 110 comprises a first time delay stage 111 and a second time delay stage 112 each presenting a time delay of T/2 (T being one cycle of the a 25 master clock signal CKM), the outputs of these stages being connected to respective input terminals of a first latch (or a flip-flop) 113, that is also included in the master oscillator 110. In the embodiment shown in FIG. 1, a Set-Reset (SR) latch (or flip-flop (F/F)) is used for the first latch 113, but the scope of the invention is not limited thereto. That is, depending on the implementation, other types of latch or flip-flop may be used. In particular, in the embodiment shown in FIG. 1, the time delay stages, 111 and 112, are respectively connected to a first or set terminal S and a second or reset terminal R of the first latch 113 being a SR latch. The master oscillator 110 outputs a master clock signal CKM at its output terminal OUTM, which is connected to a first output terminal Q of the first latch 113. The first output terminal Q of the first latch 113 is feed-back connected to the second delay stage 112. A second output terminal Qb of the first latch 113 is feed-back connected to the first delay stage 111. The signal at the second terminal Qb is the complement of the signal at the first output terminal Q, which means that when Q is high Qb is low, and when Q is high, then Q is low.

The slave oscillator 120 comprises a third time delay stage 121 and a fourth time delay stage 122 each presenting a time delay of (T/2+dt), the outputs of these stages, 121 and 122, being connected to a second latch (flip-flop) 123. As for the master oscillator, a SR latch (or a SR FF) is used for the second latch 123, but the scope of the invention is not limited thereto. In particular, the time delay stages, 121 and 122, are respectively connected to a first or set terminal S and a second or reset terminal R of this second latch 123 being a SR latch. The slave oscillator 120 further comprises an input logic block 130 including a first logic gate 131 and a second logic gate 132. In the embodiment shown in FIG. 1, for example, the first logic gate 131 and the second logic gate 132 are OR gates, however different types of logic gate may be used for alternative embodiments. The slave oscillator 120 outputs a slave clock signal CKS at its output terminal OUTS, which is connected to a first output terminal Q of the second latch 123. The first output terminal Q of the second latch 123 is also connected to a first input terminal of the second logic gate 132, having a second input terminal connected to the first output terminal Q of the first latch 113 of the master oscillator 110. A second output terminal Qb of the second latch 123 is also feed-back connected to a first input terminal of the first logic gate 131, having a second input terminal connected to the second output terminal Qb of the first latch 113 of the master oscillator 110.

In this way, the master oscillator 110 generates the master clock signal CKM and the slave oscillator 120 generates the slave clock signal CKS that has a time shift equal to dt with respect to the master clock signal CKM and the same cycle period T as the master clock signal CKM. In particular, the first and second time delay stage 111, 112 may delay an input signal of T/2, T being one cycle period of the clock signal to be generated. The delayed signal is then provided to the first latch 113. Moreover, these two time delay stages cooperate to provide a sustained oscillation with period T.

More in particular, the first time delay stage 111 provides the low-to-high transitions of the master clock signal CKM through the first latch 113, while the second 5 time delay stage 112 provides the high-to-low transitions of the master clock signal CKM through the first latch 113. The clock generator 100 may be also connected to a startup circuit not shown in FIG. 1.

Particularly, the delayed signal from the first time delay stage 111 may be provided to the set input S of the first latch 113, while the delayed signal from the second time delay stage 112 may be provided to the reset input R of the first latch 113. The first output terminal Q of the first latch 113 may be provided to the output terminal OUTM of the master oscillator 110. Then, the first output terminal Q of the first latch 113 may be provided to the second time delay stage 112, while the second output terminal Qb of the first latch 113 may be provided to the first time delay stage 111.

Moreover, the slave oscillator 120 comprises the third time delay stage 121 and the fourth time delay stage 122, each of them providing respectively the low-to-high and high-to-low transitions of the slave clock signal through the second latch 123. However, for the slave oscillator 120, the startup for the third time delay stage 121 is determined not by the second latch 123, but by a logic combination through the first logic gate 131 of the first latch 113 and the second latch 123 outputs. In the same way, startup for the fourth time delay stage 122 is determined not by the second latch 123, but by a logic combination through the second logic gate 132 of the outputs of the first latch 113 and the second latch 123.

Particularly, the delayed signal from the third delay stage 121 may be provided to the set input S of the second latch 123, while the delayed signal from the fourth time delay stage 122 may be provided to the reset input R of the second latch 113. The first output terminal Q of the second latch 123 may be provided to the output terminal OUTS of the slave oscillator 120. Then, the signal at the first output terminal Q of the second latch 123 may be provided to the input of the second logic gate 132 with the signal at the first output terminal Q of the first latch 113. In a similar way, the signal at the second output terminal Qb of the second latch 123 may be provided to the input of the first logic gate 131 with the signal at the second output terminal Qb of the first latch 113.

If the time delay for each of the third time delay stage 121 and the forth time delay stage 122 is T/2+dt (being 0<dt<T/2), then the resulting slave clock signal CKS at the output terminal OUTS of the slave oscillator 120 has the same cycle period T as that of the master clock signal CKM at the output terminal OUTM of the master oscillator 110, but is shifted in phase by dt.

Figure 2:
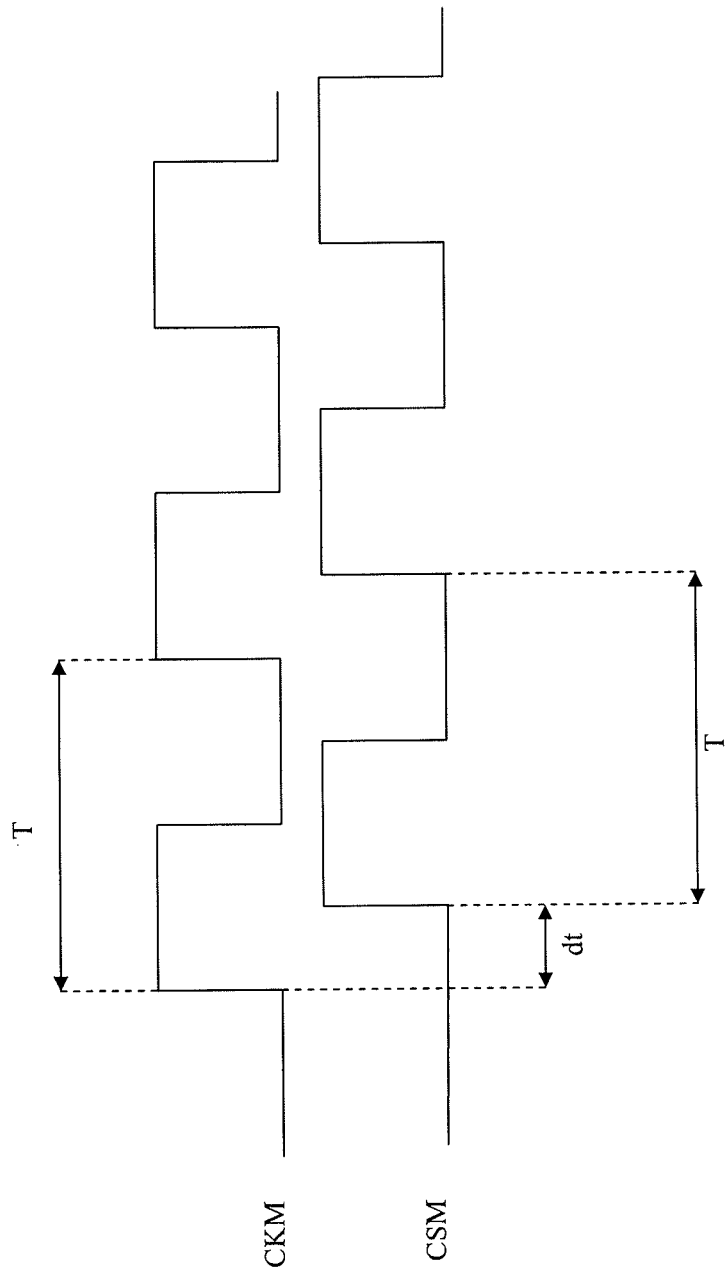
FIG. 2 schematically shows a time diagram of the output signals from the master and slave oscillators of FIG. 1.

In this respect, FIG. 2 schematically shows a graph of the signals of the master oscillator 110 and the slave oscillator 120 according to FIG. 1. In this FIG. 2, it is easily understood that the time period for the master and slave clock signal is T, and the time delay or phase between these two clock signals is dt.

In an advantageous embodiment, all time delay stages 111, 112, 121, 122 may be matched circuits. The matched circuit means that the circuits are made by using matched components such as transistors, resistors, capacitors or others. For example matched transistors are transistors fabricated in the same area of a wafer, having a same orientation, and surrounded by same components. Any one of the time delay stages 111, 112, 121, 122 may include passive components and a charging reference current defining precise delay time and fixed ration between them.

According to an embodiment of the invention, the master and slave oscillators 110, 120 may be realized by a respective charge oscillator having a symmetrical structure and a common voltage reference.

Figure 3A:
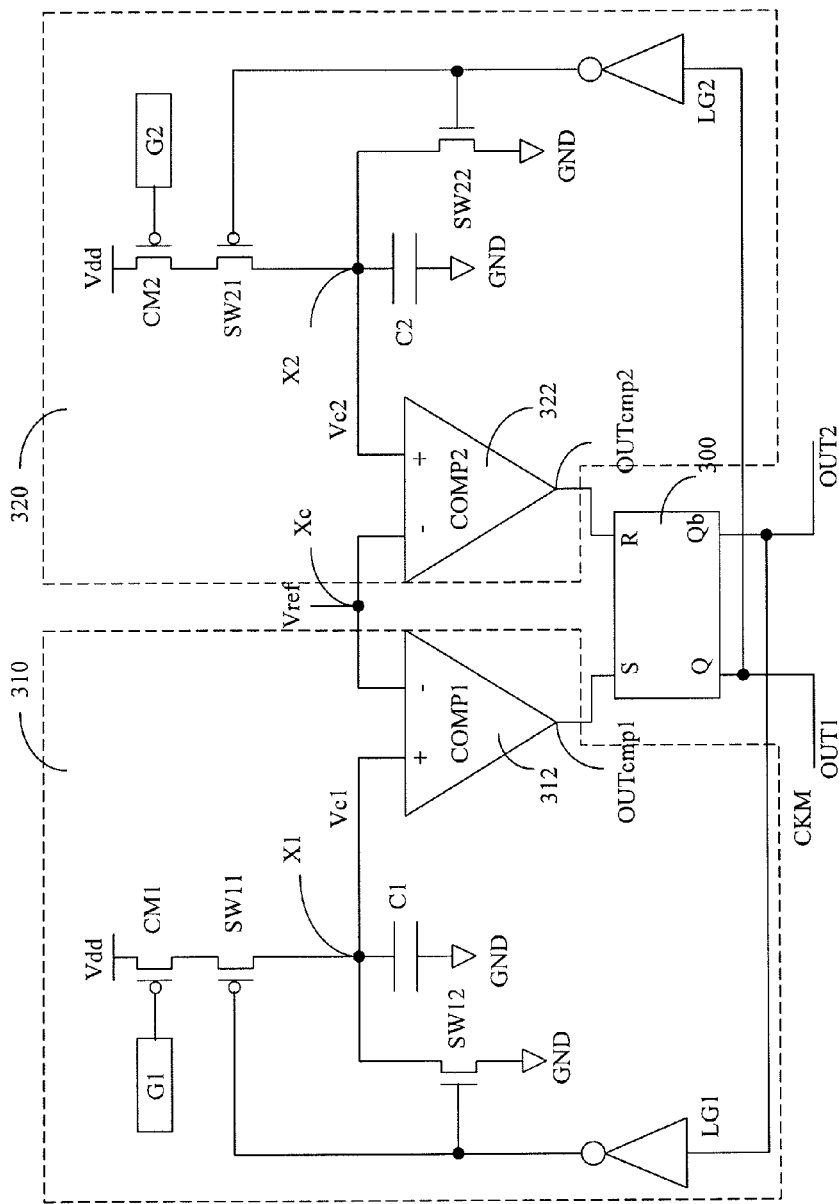
FIG. 3A schematically shows an embodiment of a master oscillator of FIG. 1.

FIG. 3A schematically shows an embodiment of the master oscillator 110 of FIG. 1 implemented by using a charge oscillator.

The master oscillator 110 comprises a first or left module 310 and a second or right module 320 and is connected to a common voltage reference Vref. The first module 310 corresponds to the first time delay stage 111 of FIG. 1 and the second module 320 corresponds to the second delay stage 112 of FIG. 1. The master oscillator 110 also includes a first common latch 300, corresponding to the first latch 113 of FIG. 1. The first common latch 300 is for instance a SR latch but the scope of the invention is not limited thereto. That is, depending on the implementation, other types of latches or flip-flops may be used. In particular, the first common latch 300 has a first input or set terminal S, a second input or reset terminal R, a first output terminal Q and a second output terminal Qb. In this exemplary embodiment, the signal at the second output terminal Qb is the complement of the signal at the first output terminal Q, which means that when Q is high Qb is low, and when Q is high, then Q is low.

More in particular, the first module 310 comprises a first comparator COMP1 312, a first current mirror transistor CM1 biased by a first reference bias generator G1 to produce a substantially constant current, a first and a second switch transistor, SW11 and SW12, an inverter as a first logic gate LG1, as well as a first capacitance block including a first capacitor C1. More in particular, the first current mirror transistor CM1, the first switch SW11 and the first capacitor C1 are inserted, in series to each other, between a power supply voltage Vdd and ground GND, a first node X1 between the first switch SW11 and the first capacitor C1 being connected to a first non-inverting (+) input of the first comparator 312.

Moreover, the second switch SW12 is inserted between the first node X1 and ground GND. The first and second switches SW11 and SW12 have respective driving terminals connected to the second output terminal Qb of the first common latch 300 through the first logic gate LG1, being a NOT gate.

Furthermore, the first comparator 312 has a second inverting terminal (−) connected to a common node Xc receiving the common reference voltage Vref and an output terminal OUTcmp1 connected to the first input or set terminal S of the first common latch 300.

In a similar manner, the second module 320 comprises a second comparator COMP2 322, a second current mirror transistor CM2 biased by a second reference generator G2 to produce a substantially constant current, a third and a fourth switch, SW21 and SW22, an inverter as a second logic gate LG2, as well as a second capacitance block including a second capacitor C2. The second current mirror transistor CM2, the third switch SW21 and the second capacitor C2 are inserted, in series to each other, between the power supply voltage Vdd and ground GND, a second node X2 between the third switch SW21 and the second capacitor C2 being also connected to a first non-inverting (+) input of the second comparator 322. Moreover, the fourth switch SW22 is inserted between the second node X2 and ground GND. The third and fourth switches SW21 and SW22 have respective driving terminals connected to the first output terminal Q of the first common latch 300, through the second logic gate LG2, being a NOT gate. The first output terminal Q of the first common latch 300 is also connected to a first output terminal OUT1 providing the master clock signal CKM, while the second output terminal Qb of the first common latch 300 is connected to a second output terminal OUT2.

Furthermore, the second comparator 322 has a second inverting terminal (−) connected to the common node Xc receiving the common reference voltage Vref and an output terminal OUTcmp2 connected to the second input or reset terminal R of the first common latch 300. The second output terminal Qb of the first common latch 300 provides an inverted master clock signal.

Figure 3B:
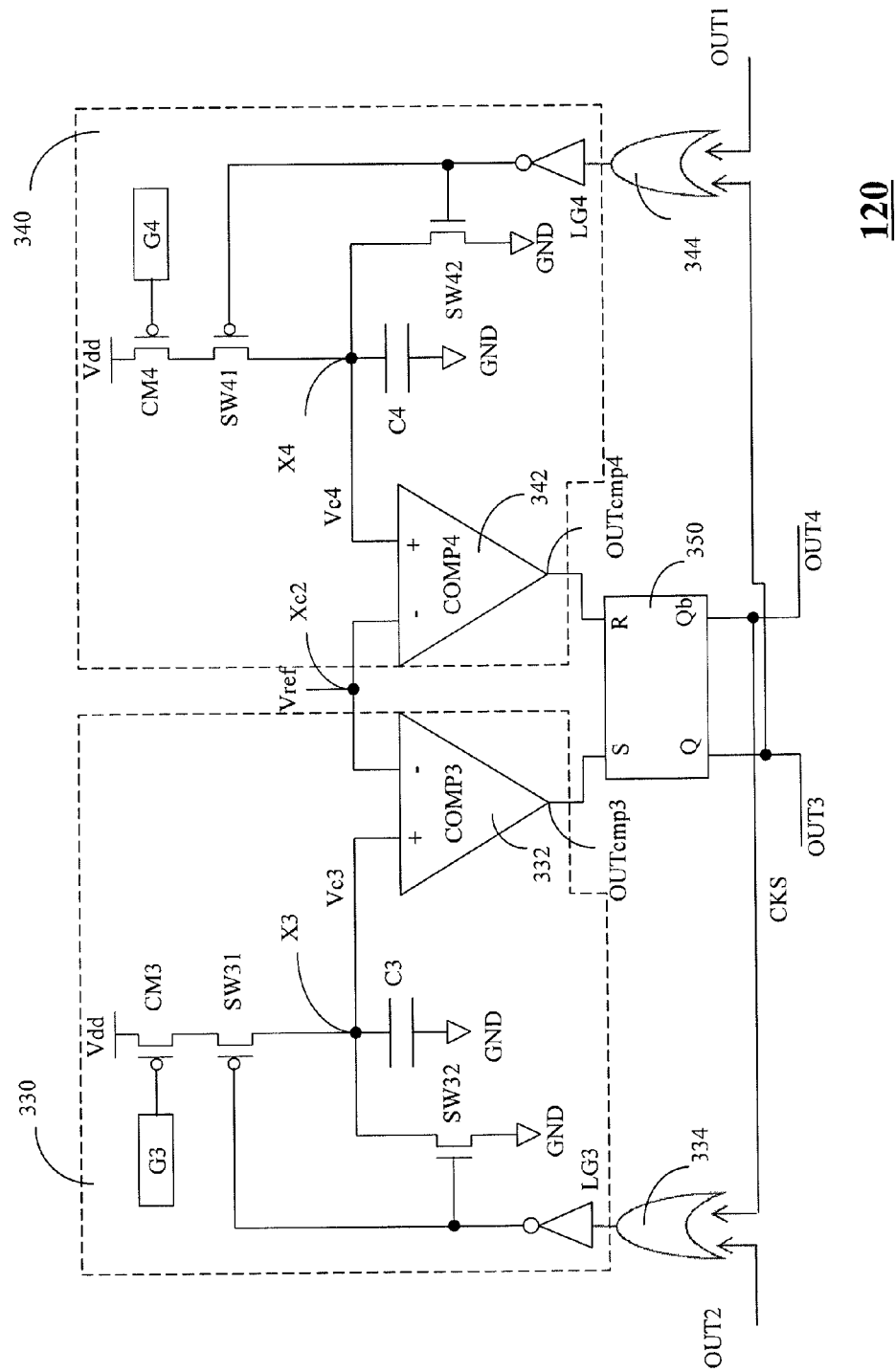
FIG. 3B schematically shows an embodiment of a slave oscillator of FIG. 1.

FIG. 3B schematically shows an embodiment of the slave oscillator 120 of FIG. 1.

The slave oscillator 120 has a basic structure being similar to the master oscillator 110 of FIG. 3A. The slave oscillator 120 then comprises a first or left module 330 and a second or right module 340 and is connected to a second common voltage reference Vref. The first module 330 corresponds to the third time delay stage 121 of FIG. 1 and the second module 340 corresponds to the fourth delay stage 122 of FIG. 1. The slave oscillator 120 also includes a second common latch 350, corresponding to the second latch 123 of FIG. 1 and being for instance a SR latch but the scope of the invention is not limited thereto. That is, depending on the implementation, other types of latch or flip-flop may be used. In particular, the second common latch 350 has a first input or set terminal S, a second input or reset terminal R, a first output terminal Q and a second output terminal Qb. In this exemplary embodiment, the signal at the second output terminal Qb is the complement of the signal at the first output terminal Q, which means that when Q is high Qb is low, and when Q is high, then Q is low. Moreover, the first output terminal Q of the second common latch 350 is connected to a third output terminal OUT3 providing the slave clock signal CKS and the second output terminal Qb of the second common latch 350 is connected to a fourth output terminal OUT4.

More in particular, the first module 330 comprises a third comparator COMP3 332, a third current mirror transistor CM3 connected to a third reference bias generator G3 to produce a substantially constant current, a fifth and a sixth switch, SW31 and SW32, a third logic gate LG3, in particular a NOT gate (inverter), as well as a third capacitance block including a third capacitor C3. More in particular, the third current mirror transistor CM3, the fifth switch SW31 and the third capacitor C3 are inserted, in series to each other, between a power supply Vdd and ground GND, a third node X3 between the third switch SW31 and the third capacitor C3 being connected to a first non inverting (+) input of the third comparator 332. Furthermore, the third comparator 332 has a second inverting terminal (−) connected to a second common node Xc2 receiving the second common reference voltage Vref, being for instance equal to the common reference voltage applied to the master oscillator 110, and an output terminal OUTcmp3 connected to the first input or set terminal S of the second common latch 350.

In a similar manner, the second module 340 comprises a fourth comparator COMP4 342, a fourth current mirror transistor CM4 connected to a fourth reference bias generator G4 to produce a substantially constant current, a seventh and a eight switch, SW41 and SW42, a fourth logic gate LG4, in particular a NOT gate, as well as a fourth capacitance block including a fourth capacitor C4. The fourth current mirror transistor CM4, the seventh switch SW41 and the fourth capacitor C4 are inserted, in series to each other, between the power supply Vdd and ground GND, a fourth node X4 between the seventh switch SW41 and the fourth capacitor C4 being connected to a first non inverting (+) input of the fourth comparator 342. Moreover, the eight switch SW42 is inserted between the fourth node X4 and ground GND.

Furthermore, the fourth comparator 342 has a second inverting terminal (−) connected to the second common node Xc2 receiving the second common reference voltage Vref, being for instance equal to the common reference voltage applied to the master oscillator 110, and an output terminal OUTcmp4 connected to the second input or reset terminal R of the second common latch 350.

Moreover, the slave oscillator 120 comprises a first logic gate 334 connected to the third logic gate LG3 of the left module 330 and a second logic gate 344 connected to the fourth logic gate LG4 of the right module 340. The first and second logic gates 334 and 344 are for instance OR gates that are equivalent to the OR gates 131 and 132 of FIG. 1.

More in particular, the first logic gate 334 has a first input terminal connected to the second output terminal Qb of the second common latch 350, i.e. to the fourth output terminal OUT4, a second input terminal connected to the second output terminal OUT2 of the master oscillator 110 and an output terminal connected to the driving terminals of the fifth and sixth switches, SW31 and SW32 through the third logic gate LG3. More in particular, the fifth switch SW31 comprises a PMOS transistor and the sixth switch SW32 comprises an NMOS transistor.

In a similar manner, the second logic gate 344 has a first input terminal connected to the first output terminal Q of the second common latch 350, i.e. to the third output terminal OUT3, a second input terminal connected to the first output terminal OUT1 of the master oscillator 110 and an output terminal connected to the driving terminals of the seventh and eight switches, SW41 and SW42 through the fourth logic gate LG4. More in particular, the seventh switch SW41 comprises a PMOS transistor and the eighth switch SW42 comprises an NMOS transistor.

The working of the master oscillator 110 of FIG. 3A is now described with reference also FIG. 4. The first switch SW11 and the second switch SW12 may be switched by the second output terminal Qb of the first common latch 300, in turn connected to the second output terminal OUT2 and duly inverted by the first logic gate LG 1. The capacitor C1 of the first capacitance block is charged by a current flowing from the first switch SW11 and discharged by a current drawn by the second switch SW12.

Moreover, the third switch SW21 and the fourth switch SW22 may be switched by the first output terminal Q of the first common latch 300, in turn connected to the first output terminal OUT1 and duly inverted by the second logic gate LG2. The capacitor C2 of the second capacitance block is charged by a current flowing from the third switch SW21 and discharged by a current drawn by the fourth switch SW22.

In this way, the signal at the second output terminal Qb of the first common latch 300 (being the opposite of the signal at the first output terminal Q) is fed back to the first and second switches, SW11 and SW12, to control the current provided by the first current mirror transistor CM1 and thus activate the charge and/or discharge of the capacitor C1 of the first capacitance block and the signal at the first output terminal Q of the first common latch 300 (being the opposite of the signal at the second output terminal Qb) is fed back to the third and fourth switches, SW21 and SW22, to control the current drawn by the second current mirror transistor CM2 and thus activate the charge and/or discharge of the capacitor C2 of the second capacitance block.

The charge and discharge of the capacitor C1 of the first capacitance blocks is repeated periodically, thus generating a period clock signal, the master clock signal, at the first output terminal Q of the first common latch 300, i.e. at the first output terminal OUT1. In other words, the signal transition propagates starting from the first node X1, to the first comparator 312, the first input terminal S of the first common latch 300, and from the first output terminal Q of the first common latch 300, to the third switch SW21 and the capacitor C2 of the second capacitance block i.e. to the second node X2.

In a similar manner, the charge and discharge of the capacitor C2 of the second capacitance block is repeated periodically, thus generating a period clock signal, an inverted master clock signal, at the second output terminal Qb of the first common latch 300, i.e. at the second output terminal OUT2.

In other words, the signal transition propagates starting from the second node X2, to the second comparator 322, the second input terminal R of the first common latch 300, and from the second output terminal Qb of the first common latch 300, to the first switch SW11 and the capacitor C1 of the first capacitance block i.e. to the first node X1.

The capacitor C1 of the first capacitance block and the capacitor C2 of the second capacitance block may be equal and matched in size, if the duty cycle of the output signal of the master oscillator 110 needs to be 0.5. Moreover, the current provided by the two current generators G1 and G2 may be equal and the current mirror transistors CM1 and CM2 matched in size, if the duty-cycle of the output signal of the master oscillator 110 needs to be 0.5. Furthermore, the size ratio between the capacitor C1 of the first capacitance block and the capacitor C2 of the second capacitance block, as well as the current ratio of the first current mirror transistor CM1 and the second current mirror transistor CM2 may be configured to obtain different duty cycles.

Moreover, the first current mirror transistor CM1 and the second current mirror transistor CM2 may be output stages of circuits mirroring and scaling a reference current provided by a current generator, G1 and G2 respectively, for instance being a current showing a limited variation with temperature and power supply.

In essence, the first comparator 312 and the second comparator 322 respectively sense the voltage value at the first node X1 and the second node X2, and provide respective output signals when the first node X1 and the second node X2 are higher than the common reference voltage Vref. The reference voltage Vref may also be a voltage having a limited variation with temperature and power supply.

Being the output terminals, OUTcmp1 and OUTcmp2, of the first and second comparators, 312 and 322, coupled respectively to the set and reset input terminals, S and R, of the first common latch 300, being a SR latch, a master clock signal CKM is provided by the master oscillator 110 at the first output terminal OUT1, being connected to the first output terminal Q of the first common latch 300. It is easily understood by a skilled person in the art that also the signal at the second output terminal OUT2, being connected to the second output terminal Qb of the first common latch 300 may provide an inverted master clock signal, being a complement of the clock signal at the first output terminal OUT1.

Due to the corresponding structure, the working of the slave oscillator 120 is similar to the one of the master oscillator 110 and a slave clock signal CKS is provided at the third output terminal OUT3 and, in an inverted form, at the fourth output terminal OUT4

It should be noted, however, that the capacitance of the third capacitor C3 and of the fourth capacitor C4 as well as the size of the third current mirror transistor CM3 and of the fourth current mirror transistor CM4 of the slave oscillator 120 might be different with respect to their counterparts in the master oscillator 110, i.e. the first and second capacitors C1 and C2 and the first and second current mirror transistors CM1 and CM2.

More in particular, the ratio between the first capacitor C1 and the third capacitor C3 and the ratio between the second capacitor C2 and the fourth capacitor C4 may be chosen to define the time shift between the master clock signal CKM at the first output terminal OUT1 and the slave clock signal CKS at the third output terminal OUT3. Also, the ratio between the mirror factor of the first current mirror transistor CM1 and the third current mirror transistor CM3 and the ratio between the mirror factor of the second current mirror transistor CM2 and the fourth current mirror transistor CM4 can be chosen to define the time shift between the master clock signal CKM and the slave clock signal CKS.

The time shift between the master clock signal CKM and the slave clock signal CKS is obtained by slowing the ramp voltage applied to the capacitors C3 and C4 of the slave oscillator 120 with respect to the ramp voltage applied to capacitors C1 and C2 of the first and second capacitive blocks of the master oscillator 110.

In a general form, a slower ramp for the charging of the third node X3 of the slave oscillator 120 than the ramp for the charging the first node X1 of the master oscillator 110 may be obtained as follows:
- by having a lower charging current applied to the third capacitor C3, the capacitance value of this third capacitor C3 being the same of that of the corresponding first capacitor C1 of the master oscillator 110;
- by using a same current for the first and third capacitors, C1 and C3, the latter having a bigger capacitance value;
- by combining the previous two modes, i.e. using a lower current and a bigger capacitance for the third capacitor C3 than for the first capacitor C1.

The above can be also applied for obtaining a slower ramp for the charging of the fourth node X4 of the slave oscillator 120 than a ramp for the charging of the second node X2 of the master oscillator 119, the second and fourth capacitors, C2 and C4 being at stake.

Alternatively, the time shift between the master clock signal CKM and slave clock signal CKS could be obtained, employing the same ramp voltage, by changing the value of the voltage reference Vref, the value of this voltage reference Vref for the slave oscillator 120 being higher that the one for the master oscillator 120, thus making the second common latch 350 switching with delay with respect to the first common latch 300.

For example, if a time shift of T/4 is needed between the master clock signal CKM of the master oscillator 110 and the slave clock signal CKS of the slave oscillator 120, then the following conditions may be chosen:
1. (the mirror factor of the first current mirror transistor CM1)/(the mirror factor of the third current mirror transistor CM3)=1
2. (the mirror factor of the second current mirror transistor CM2)/(the mirror factor of the fourth current mirror transistor CM4)=1
3. the capacitance ratio C3/C1=1.5
4. the capacitance ratio C4/C2=1.5
5. the same voltage reference Vref for both master and slave oscillators, 110 and 120.

In the above condition, since the mirror factors are same but the ratios of the capacitance values are different and the time required to charge a capacitor is proportional to the capacitance value, indeed, the time required for charging the capacitors C3 and C4 in the slave oscillator 120 is longer than that for charging the capacitors C1 and C2 in the master oscillator 110. In this way, the slave clock signal CKS at the output of the slave oscillator 120 has a time shift with respect to the master clock signal CKM at the output of the master oscillator 110.

In another example, different conditions may be chosen to obtain a same amount of time shift. The conditions maybe as follows:
1. (the mirror factor of the first current mirror transistor CM1)/(the mirror factor of the third current mirror transistor CM3)=1.5

2. (the mirror factor of the second current mirror CM2)/(the mirror factor of the fourth current mirror transistor CM4)=1.5
3. the capacitance ratio C3/C1=1
4. the capacitance ratio C4/C2=1
5. the same voltage reference Vref for both master and slave oscillators, 110 and 120.

In the above condition, since the ratios of the capacitance values are the same but the mirror factors are different and the time required to charge a capacitor is inversely proportional to the charging current, the time required for charging the capacitors C3 and C4 in the slave oscillator 120 is longer than that for charging the capacitors C1 and C2 in the master oscillator 110. Then, also in this case, the slave clock signal CKS at the output of the slave oscillator 120 has a time shift with respect to the master clock signal CKM at the output of the master oscillator 120. The amount of the time shift is the same as that of the previous condition.

To explain the operation of the clock generator I 00 more specifically, making reference to FIGS. 3A and 3B, when the master oscillator II 0 triggers a falling edge for the output signal at the first output terminal Q of the first common latch 300, i.e. the first output terminal OUT1, that corresponds to a rising edge for the output signal at the second output terminal Qb of this first common latch 300, i.e. the second output terminal OUT2, then the third current mirror transistor CM3 of the slave oscillator 120 allows a current charging the third capacitor C3 by turning on the fifth switch SW31. The third node X3 then starts rising. If one of the aforementioned design choices is made, the charging of the third node X3 in the slave oscillator 120 is 50% slower than the charging for the corresponding first node XI in the master oscillator I1 0. When the third node X3 reaches the value of the reference voltage Vref, the third comparator 332 rises the signal at the set input terminal S of the second common latch 350 and the first output terminal Q of the second common latch 350, i.e. the third output terminal OUT3, is then set.

A rising edge of the output signal at the first output terminal Q of the second common latch 350, i.e. of an output signal Vout3 at the third output terminal OUT3, corresponds to a falling edge of the output signal at the second output terminal Qb of the second common latch 350, i.e. of an output signal Vout4 of the fourth output terminal OUT4, the charging of the third node X3 being thus stopped through the first logic gate 334 and the discharging of the third node X3 being accomplished through the sixth switch SW32.

In fact, the first logic gate 334 in this phase has both its input terminals receiving the signals of the second and fourth output terminals, OUT2 and OUT4, which are at a low logic level. Therefore, being the first logic gate 334 a OR gate, its output would then lower at a low logic level, and the output of the inverter LG3 would then raise to high logic level, in this way turning off the fifth switch SW31 (which comprises a PMOS transistor) thus stopping the charging of the third node X3, and, at the same time, turning on the sixth switch SW32 (which comprises an NMOS transistor) thus discharging to ground the third node X3.

In the same way, when the master oscillator 110 triggers a rising edge of the output signal Vout1 at the first output terminal OUT1, that corresponds to a falling edge of the output signal Vout2 at the second output terminal OUT2, then the fourth current mirror transistor CM4 of the slave oscillator 120 allows a current charging the fourth capacitor C4 by turning on the seventh switch SW41. The fourth node X4 then starts rising. Again, the charging of the fourth node X4 in the slave oscillator 120 is 50% slower than the charging of the corresponding second node X2 in the master oscillator 110.

When the fourth node X4 reaches the value of the common reference voltage Vref, the fourth comparator 342 rises the signal at the reset input R of the second common latch 350 and the second output terminal Qb of the second common latch 350 is set. A rising edge of the output signal at the second output terminal Qb of the second common latch 350, i.e. of the output signal Vout4 at the fourth output terminal OUT4, corresponds to a falling edge of the output signal at the first output terminal Q of the second common latch 350, i.e. of an output signal Vout3 at the third output terminal OUT3, the charging of the fourth node X4 being then stopped through the second logic gate 344.

In fact, the second logic gate 344 in this phase has both its input terminals receiving the signals of the first and third output terminals, OUT1 and OUT3, which are at a low logic level. Therefore, being the second logic gate 344 a OR gate, its output would then lower at a low logic level, and the output of the inverter LG4 would then raise to high logic level, in this way turning off the seventh switch SW41 (which comprises a PMOS transistor) thus stopping the charging of the fourth node X4, and, at the same time, turning on the eight switch SW42 (which comprises an NMOS transistor) thus discharging to ground the fourth node X4.

It is noted that a rising edge of the output signal Vout2 at the second output terminal OUT2, that corresponds to a falling edge of the output signal Vout1 at the first output terminal OUT1, initiates the charging of the third node X3. Therefore, the third node X3 has already started ramping when the output signal Vout3 at the third output terminal OUT3 rises and the output signal Vout4 at the fourth output terminal OUT4 falls. It is also noted that a rising edge of the output signal Vout1 at the first output terminal OUT1, that corresponds to a falling edge of the output signal Vout2 at the second output terminal OUT2, initiates the charging of the fourth node X4. Therefore, the fourth node X4 has already started ramping when the output signal Vout3 at the third output terminal OUT3 rises and the output signal Vout4 at the fourth output terminal OUT4 falls.

Figure 4:
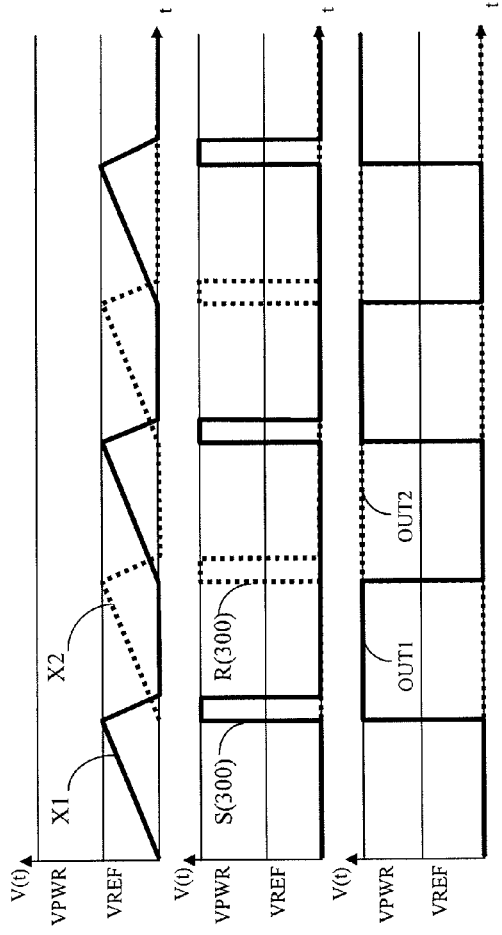
FIG. 4 schematically shows a time diagram of signals of the master and slave oscillators of FIGS. 3A and 3B.
Figure 4:
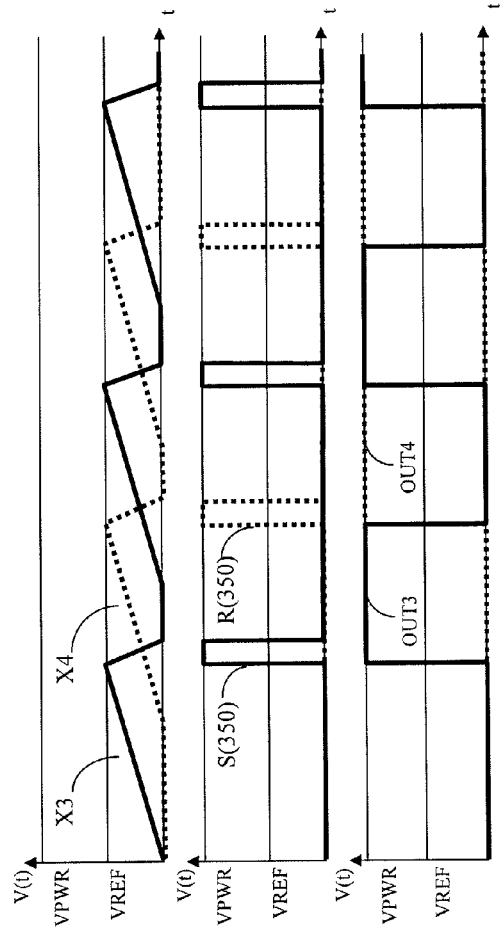

FIG. 4 schematically shows a time diagram of a clock generator comprising 10 the master oscillator 110 of FIG. 3A and the slave oscillator 120 of FIG. 3B.

The voltage against time diagram shows the pattern of the voltages V(t) of the first, second, third and forth nodes X1, X2, X3 and X4, the voltages at the input terminals S and R of the common latches 300 and 350, and the voltages at the output terminals OUT1, OUT2, OUT3 and OUT4, each against time (t). VPWR may be the supply voltage Vdd in FIGS. 3A and 3B, and VREF the reference voltage Vref in FIGS. 3A and 3B. It is noted that the time shift between the output signal Vout3 at the third output 15 terminal OUT3 and the output signal Vout1 at the first output terminal output OUT1 as well as the time shift between the output signal Vout4 at the fourth output terminal OUT4 and the output signal Vout2 at the second output terminal OUT2 is constant and equal to T/4 after a short latency startup time.

In particular, the signal at the first output terminal OUT1 is the master clock signal CKM, while the signal at the third output terminal OUT3 is the slave clock signal CKS. It is noted that the slave clock signal CKS has a same waveform but is shifted with respect to the master clock signal CKM. In particular, the voltage patterns of the input terminals S and R of the first common latch 300 show that when the voltage at the first node X1 reaches the value of the common voltage reference Vref, the corresponding first comparator 312 switches at the set terminal S of the first common latch 300 and raises the master clock signal CKM and when the voltage at the second node X2 reaches the value of the common voltage reference Vref, the reset terminal R of the first common latch 300 switches and lowers the master clock signal CKM. The voltage patterns at the third and fourth nodes, X3 and X4, also show that a slower ramp is needed, being for instance 1.5 times slower than the one for the first and second nodes, X1 and X2, the generation of the slave clock signal CKS being provided in an analogous manner than the generation of the master clock signal CKM.

The first, second, third and fourth capacitors, C1, C2, C3 and C4, as well as the first, second, third and fourth current mirror transistors, CM1, CM2, CM3 and CM4, may have a layout comprising interleaved structures in order to improve the respective matching and achieve greater accuracy in both duty cycle and time shift. The first, second, third and fourth comparators, 312, 322, 332 and 342, may also be drawn as matched structures to match offset and achieve a better precision for the clock generator 100 as a whole. With such a design, the time shift accuracy relies upon the matching between the components of the master and slave oscillators. This matching can be very high for integrated electronic circuits. Moreover, shift time is highly insensitive to the power supply reference and the temperature variation being tied to the period time of these precise oscillators. The architecture as described allows an extremely flexible configurability for the time shift.

In particular, if the time shift between the two oscillators is a fixed design parameter and does not need to be changed then no extra configurations are needed to adjust the time shift if clock period is varied. In fact, because of the component ratios, the time shift over period ratio will be maintained when a different period value is selected.

Meanwhile, combining more than one slave oscillators, it is possible to make a clock generator which generates more than one slave clock signals, each slave clock signal having a different phase.

Figure 5A:
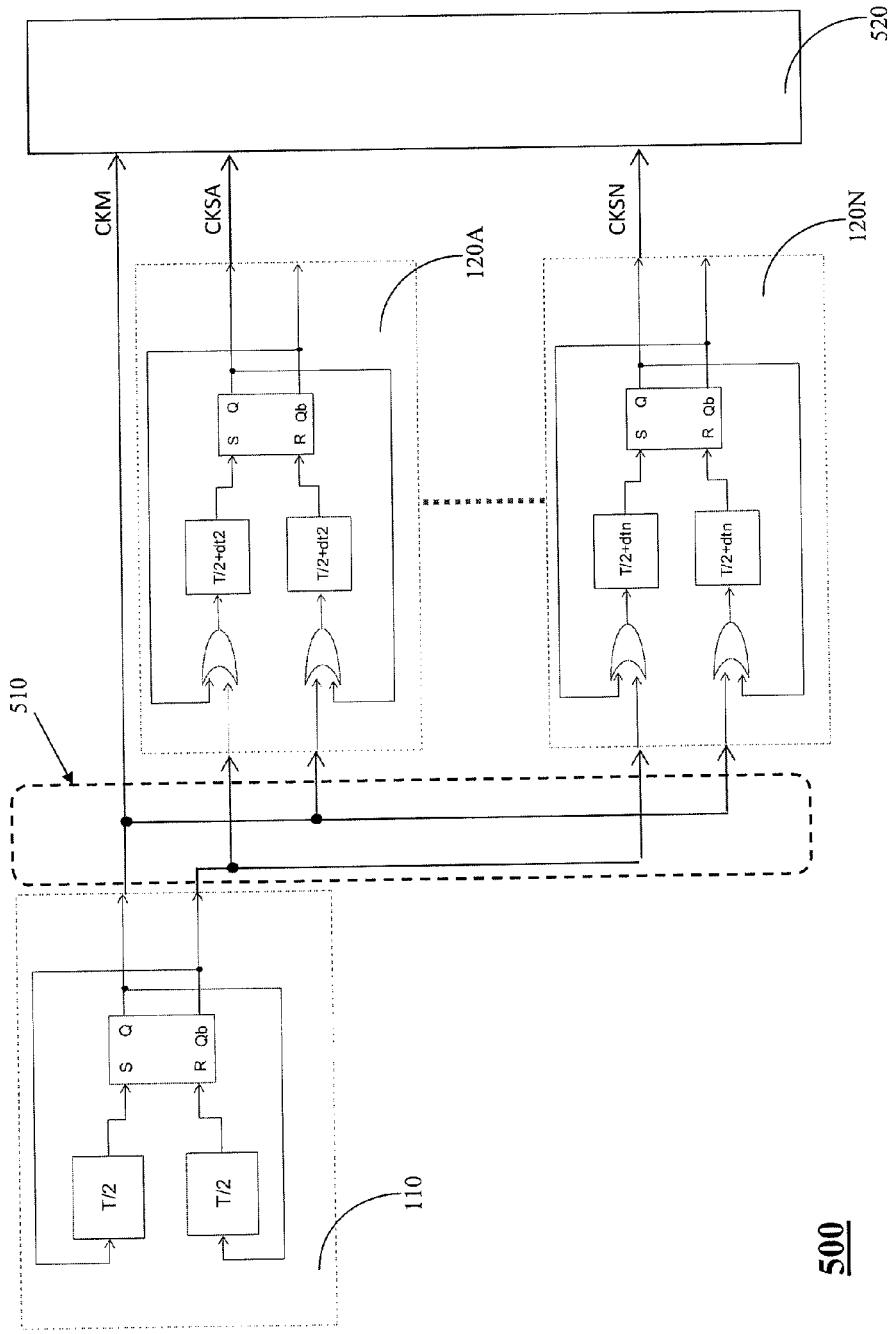
FIG. 5A schematically shows a clock generator having more than one slave oscillators connected in parallel according to a second embodiment of the invention.

FIG. 5A schematically shows a clock generator 500 according to a second embodiment of the invention, that includes more than one slave oscillators 120A . . . 120N connected in parallel to each other such that each of the slave oscillators 120A-120N receives true and complementary the master clock signals CKM.

More in particular, the clock generator 500 comprises a master oscillator 110 and the plurality of slave oscillators 120A . . . 120N. Each slave oscillator 120 is connected with the master oscillator in a direct manner, in a connection area indicated by 510. The master oscillator 110 generates the master clock signal CKM, and the slave oscillators 120A . . . 120N generates the slave clock signal CKSA . . . CKSN, respectively. The time delay stages of the master oscillator may delay an input signal by T/2, T being one cycle period of the clock signal to be generated. Also, the time delay stages of the slave oscillators 120A . . . 120N may delay an input signal by T/2+dt2 (being 0<dt2<T/2) . . . T2+dtn (being 0<dtn<T2), respectively. As an example, if four clock signals are needed with a time shift of T/8 among them, then a first slave oscillator 120A may charge its capacitors with a slope that is 1/(1+1/4) with respect to the master oscillator 110. A second slave oscillator 120B would then need to charge its capacitors with a slope of 1/(1+2/4), i.e. 1/(1+1/2) with respect to the master oscillator 110. A third slave oscillator 120C would also need to charge its capacitors with a slope of 1/(1+3/4) i.e. 1/(1+1/2+1/4) with respect to the master oscillator 110.

In fact, considering that the master oscillator 110 needs to charge its capacitors in T/2, if a time shift of T/8 is required among the master and each of slave oscillators, 110 and 120, then the first slave oscillator 120A needs to charge its capacitors in T/2+T/8=5T/8, the second slave oscillator 120B needs to charge its capacitors in T/2+T/4 and the third oscillator 120C needs to charge its capacitors in T/2+T/4+T/8.

A logic block 520 may be also connected to the outputs of the master oscillator and of the slave oscillators in order to combine the outputted clock signals.

The charging time of each of the slave oscillators 120A . . . 120N can be adjusted as explained before.

Figure 5B:
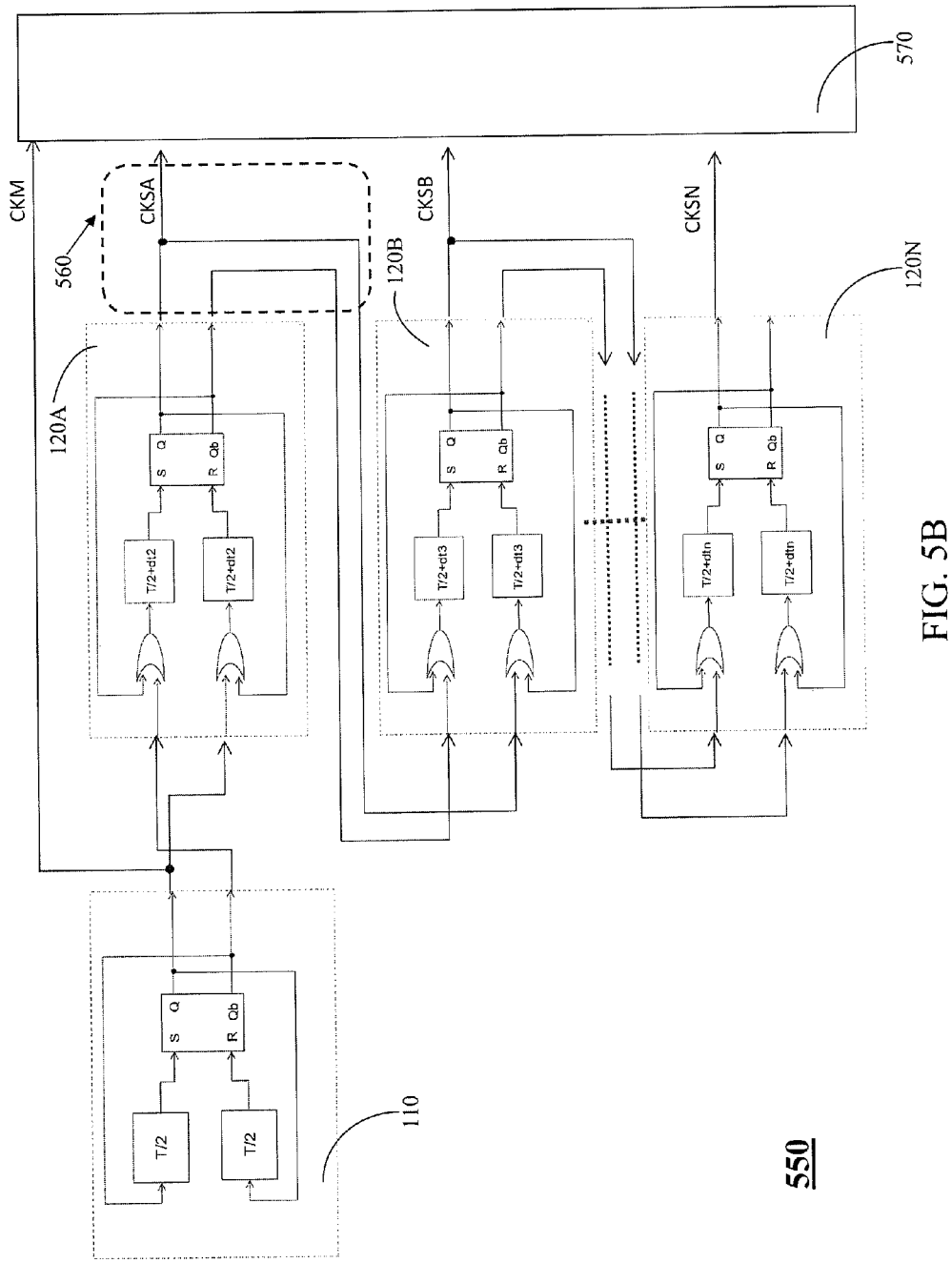
FIG. 5B schematically shows a clock generator having more than one slave oscillators connected in series according to a third embodiment of the invention.

FIG. 5B schematically shows a clock generator 550 according to a third embodiment of the invention, that includes more than one slave oscillator 120A, 120B . . . 120N connected in series to each other such that the slave oscillators 120A-120N are connected in cascade fashion so that the slave clock signal of the preceding one of the slave oscillators is supplied to the succeeding one thereof with the first stage 120A being supplied with the master clock signal.

More in particular, the clock generator 550 comprises a master oscillator 110 and the plurality of slave oscillators 120A, 120B . . . 20N, the slave oscillators being connected to one another, in a connection area indicated by 560 for a first slave oscillator 120A connected to a second slave oscillator 120B. The master oscillator 110 generates the master clock signal CKM, and the slave oscillators 120A, 120B . . . 120N generates the slave clock signal CKSA, CKSB . . . CKSN, respectively. The time delay stages of the master oscillator may delay an input signal by T/2, T being one cycle period of the clock signal to be generated. Also, the time delay stages of the slave oscillators 120A, 120B . . . 120N may delay an input signal by T/2+dt2 (being 0<dt2<T/2), T/2+dt3 (being 0<dt3<T/2) . . . T2+dtn (being 0<dtn<T2), respectively. For example, if four clock signals are needed with a time shift of T/8 among them, the clock generator 550 can be designed in such a way that each of the slave clock signal may have a same delay of a slope of 1/(1+1/4) with respect to the previous one. The output clock signal of each slave oscillator will be delayed sequentially with respect to the previous slave oscillator. In particular, a clock signal outputted by a first slave oscillator 120A would have a shift with reference to the master clock signal while the clock signal outputted by a second slave oscillator 120B would have a shift with reference to the clock signal outputted by the first slave oscillator 120A, and so on.

A logic block 570 may be also connected to the outputs of the master oscillator and of the slave oscillators in order to combine the outputted clock signals.

Also in this case, the charging time of each of the slave oscillators 120A . . . 120N can be adjusted as explained before.

Figure 5C:
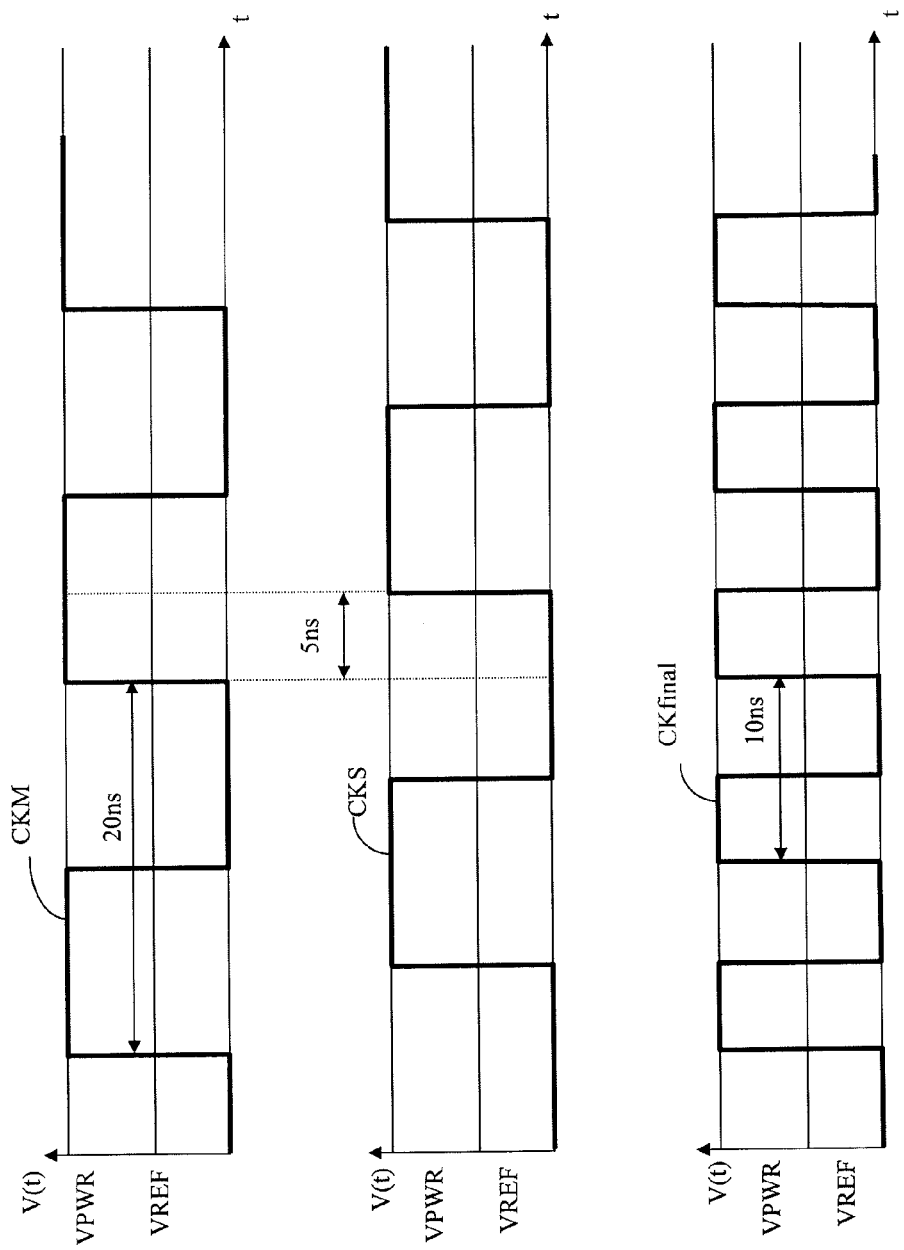
FIG. 5C schematically shows a time diagram according to a fourth embodiment of the invention.

FIG. 5C schematically shows a time diagram according to the fourth embodiment of the present invention, which is retrieved by applying ex-or operation on the outputs of master and slave clock signals generated respectively by the master and slave clock generators described so far. The voltage against time diagram shows the pattern of the voltages V(t) of CKM and CKfinal against time (t), and VPWR may be the supply voltage Vdd and VREF the reference voltage Vref in FIGS. 3A and 3B. As shown in FIG. 5C, a final clock signal CKfinal having higher frequency than the mast clock signal is thus derived.

More specifically, the final clock signal CKfinal is simply obtained by EX-OR combining a master clock signal CKM and a slave clock signal CKS, the final clock signal CKfinal thus having a higher frequency with respect to the master clock signal CKM. In particular, it is to be noted that the so obtained high frequency clock signal is stable and very precise.

For example, by using a master oscillator 110 and a slave oscillator 120 with a period of 20 ns and a time shift of T/4, i.e.

5 ns between them, the final clock signal CKfinal with a period of 1 Ons could be obtained, as shown in FIG. 5C.

Alternatively, four slave oscillators with a period of 40 ns and a time shift of T/8, i.e. 5 ns may be employed in an architecture as the clock generator 550 of FIG. 5B, and the slave clock signals at the outputs of the slave oscillators may be combined by a simple logic circuit 570 to obtain a final clock signal with a period of 10 ns.

Figure 6A:
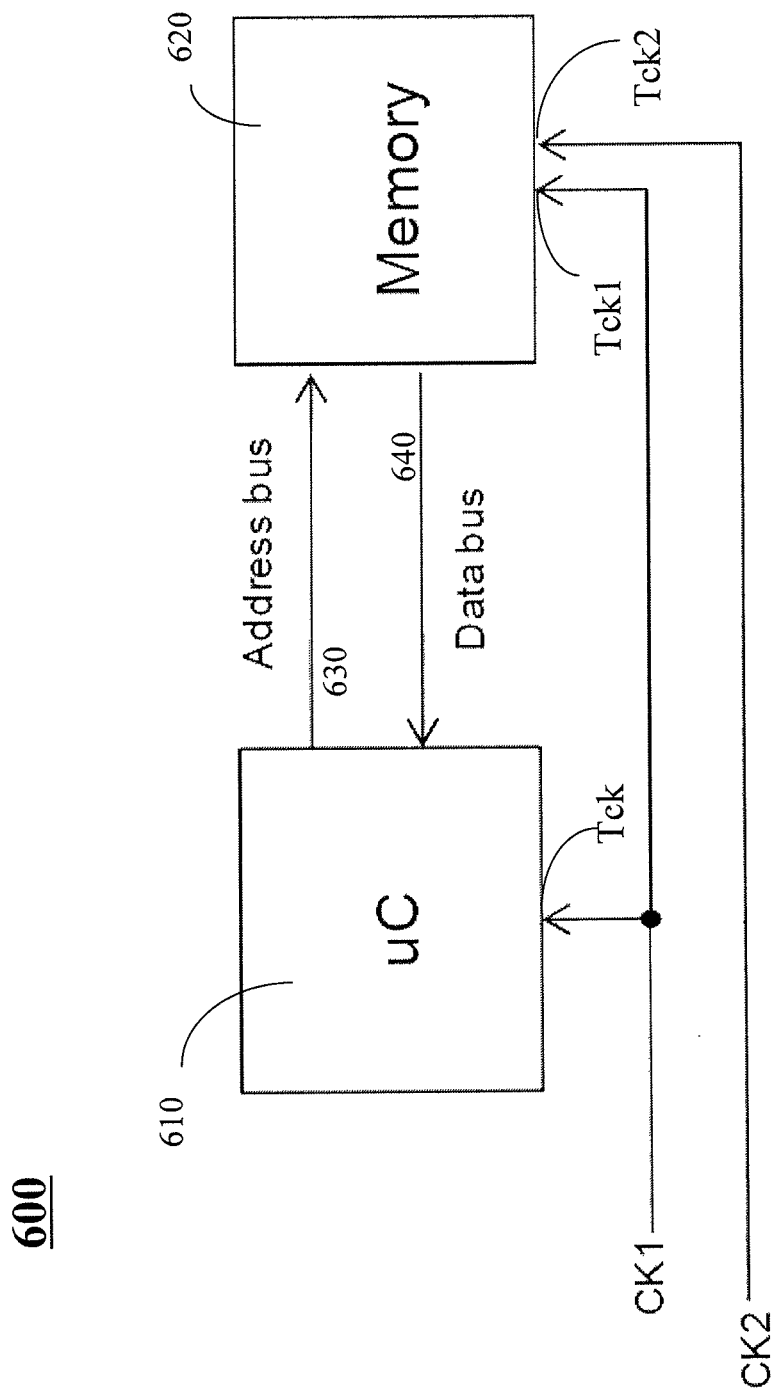
FIG. 6A schematically shows a memory architecture indicative of a fifth embodiment of the invention.

FIG. 6A schematically shows a block diagram indicative of as a fifth embodiment of the invention, an architecture comprising at least a microprocessor and a memory which require different clock signals, in particular a first and a second clock signal, CK1 and CK2.

More in particular, the architecture 600 comprises a micro-controller uC (or any other type controller such as a memory controller) 610 and a memory 620, connected to each other by means of an address bus 630 and a data bus 640. The architecture 600 also comprises a first and a second clock signal, CK1 and CK2 respectively. More in particular, the first clock signal CK1 is connected to a clock terminal Tck of the micro-controller 610 and to a first clock terminal Tck1 of the memory 620, while the second clock signal CK2 is connected to a second clock terminal Tck2 of the memory 620. In this architecture, the micro-controller 610 retrieves data from the memory 620, or store data into the memory 620. The clock signals CK1 and CK2 are generated respectively by the master clock generator and the slave clock generators described above in connection with FIGS. 1-5B

FIG. 6B schematically shows a time diagram of the clock signals CK1, CK2 and of the buses 630, 640 when the microprocessor 610 retrieves data from memory 620 according to the architecture of FIG. 6A.

More in particular, the micro-controller 610 asserts address information on the address bus 630 with a setup delay tsetup with respect to a rising edge of the first clock signal CK1. The uC 610 may issue other control signals (not shown) to read out data from the memory 620. Between the rising edge of the first clock signal CK1 and a rising edge of the second clock signal CK2, the address is decoded internally of the memory 620, and all the bit-lines (not shown) in the memory 620 to be read are precharged in a time delay tprech. Then, after the rising edge of the second clock signal CK2, the evaluation phase of the memory 620 is initiated and it outputs a valid data on the data bus 640 after the time delay teval. Thus, two clock signals CK1 and CK2 are needed with different phases, in particular with a precise phase-shift between them. These two clock signals may be obtained by a clock generator according to the above embodiments of the present disclosure.

Some applications also require that the oscillation period is adjusted. Such adjustment may de done during a testing phase of a memory device. In this case, in order to adjust the oscillation period, driving signals of the clock generator may be used on the basis of configuration values already stored.

In particular, driving signals of the clock generator are input digital signals in the clock generator block, being used for different purposes, such as to adjust the clock period and/or the phase shift between the master and slave oscillators. According to FIGS. 6A and 6B, CK1=CKM and CK2=CKS are the two output clock signals of the generator block, while the input driving signals are for example provided by the date bus and are then used to adjust phase shift between the clock signals CKM and CKS as above explained.

In a similar way, these input driving signals may be employed to configure or finely adjust the oscillation period of the clock signals CKM and CKS. In this case, both master and slave oscillators need to be provided with a respective configuration circuit.

Alternatively a subset of the signal bus lines can be used to adjust the oscillation period and another subset can be used to adjust the phase shift.

It should be remarked that these driving signals, also indicated as "configuration signals", are typical in flash memory devices. They are used to configure or finely adjust on-board analog circuits. In particular, these driving signals deliver information stored in fuses, or stored in a specific flash memory area and can be written during a testing phase of the flash memory, being usually loaded at the power-on stage.

For example, considering that a 10 ns shift between the master and slave clock signals is needed, this shift corresponds to the digital code 010 when using a driving or "configuration" signal bus of 3 bits (but in general it can be of any length).

During a test-mode phase, the code 010 should be thus written in a corresponding area of the flash memory device through the data and/or configuration bus. In this way, this code will be read at every flash memory power-up, stored in specific latches or flip-flops and delivered to the corresponding analog circuit (in this case the slave oscillator) by means of the driving or "configuration" bus lines.

Suitable driving signals may be applied to the clock generator according to the present disclosure in order to configure the time-shift between the provided master and slave clock signals.

Figure 7A:
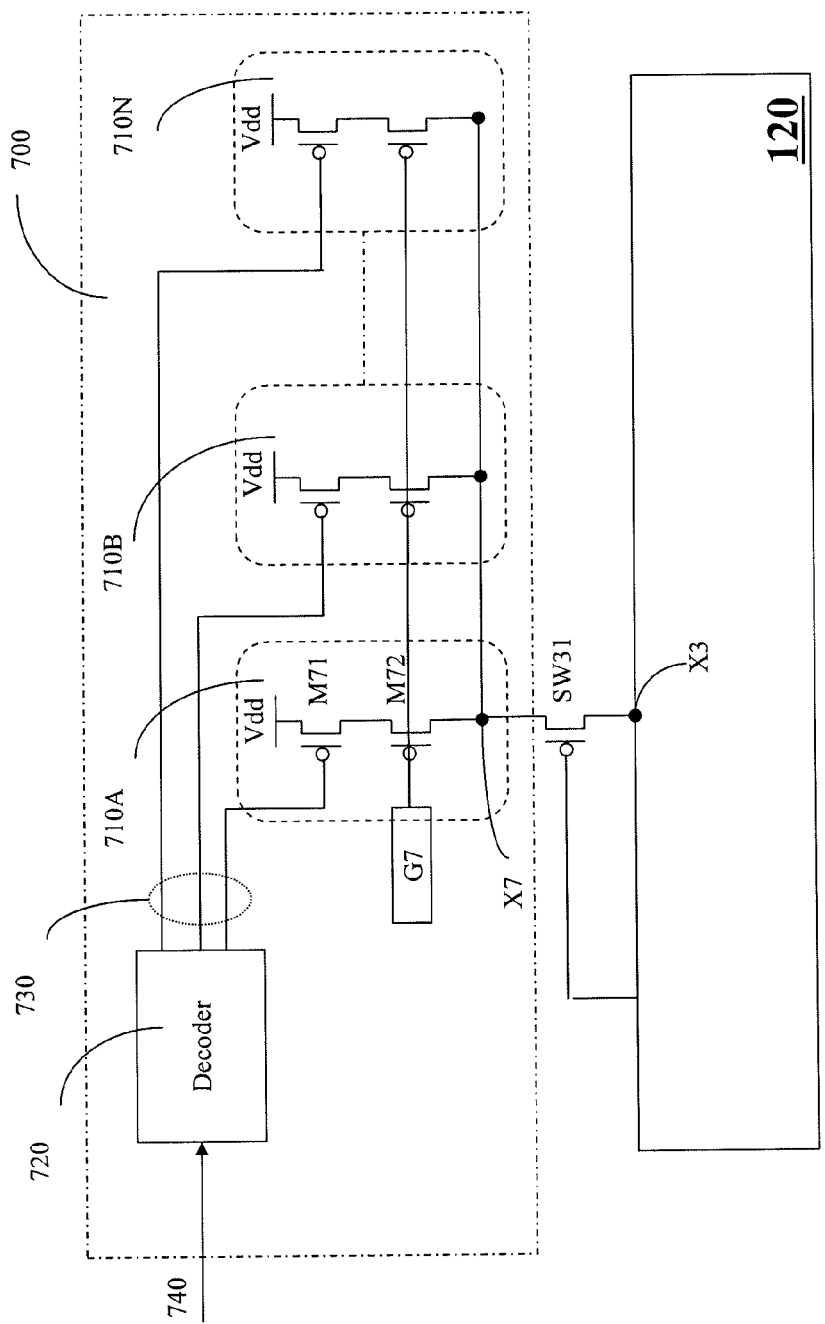
FIG. 7A schematically shows a configurable current mirror for the slave oscillator according to a sixth embodiment of the invention.

FIG. 7A schematically shows a configurable current mirror 700, that may be used in place of current circuit of G3 and CM3 in the slave oscillator 120 as shown in FIG. 3B, according to another embodiment of the invention. The output of the current mirror 700 is thus connected to the switch transistor SW31.

The current mirror 700 comprises a decoder 720 connected to N input lines of an input bus 740 as configuration data, the decoder thus including an output bus 730 of $2^N$ control lines. A control unit (not shown) or the uC 610 may provide the configuration data to the decoder 720 through the input bus 740. The current mirror 700 also comprises a plurality of switch blocks, 710A . . . 710N, each inserted between a supply voltage reference Vdd and a common node X7, which is in turn connected to the third node X3 of the slave oscillator 120 through the fifth switch SW31. In particular, each switch block 710 comprises a switching transistor M71 and a mirror-connected transistor M72 connected in series to each other between the supply voltage reference Vdd and the common node X7, the switching transistor M71 having a control or gate terminal connected to one control line of the output bus 730. Moreover, the mirror-connected transistors M72 of the switch blocks 710A . . . 710N have their control or gate terminals connected in common to a bias generator G7. Each transistor M72 thus produces a substantially constant current.

It should be noted that the decoder 720 selectively set or reset each of the $2^N$ control lines of the output bus 730 to enable selected one or ones of the switch blocks 710A . . . 710N. The mirror-connected transistor M72 of the selected switch block controls the amount of current flowing therethrough, such current amount being controlled by the bias circuit G7. That is to say, the mirror-connected transistor M72 of each switch block 710A . . . 710N is a current mirror that allows a current flowing whose amount depends on the mirror factor of the second switching transistor M72 indeed.

The switching transistor M71 is a configuration switch which switches on or off the current flowing through itself, driven by the configuration data outputted by the decoder 720 on the control lines of the output bus 730. In this way, based on the configuration data provided by the decoder 720, the current flowing to the common node X7 and thus to the third node X3 of the slave oscillator 120 can be controlled by the configurable current mirror 700.

In essence, the configurable current mirror 700 allows a selection of the time shift between the master and slave clock signals by changing a mirroring factor and thus the current provided to the slave oscillator 120.

In order to obtain a proper time shift, another configurable current mirror 700 with a second plurality of switch blocks should be applied also to the fourth node X4 of the slave oscillator 120, the decoder 720 can be shared.

Figure 7B:
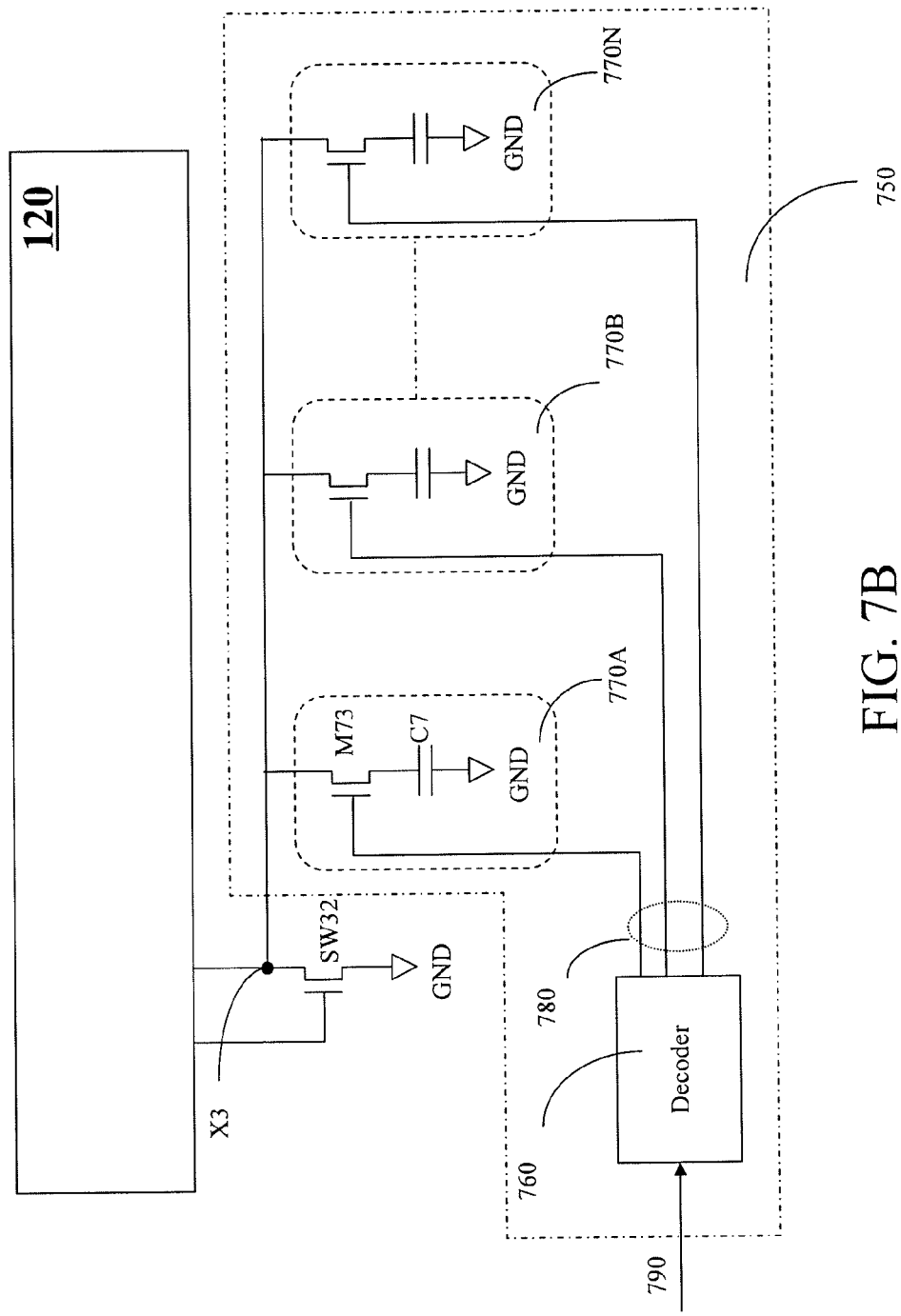
FIG. 7B schematically shows a configurable capacitance block for the slave oscillator according to a seventh embodiment of the invention.

FIG. 7B schematically shows a configurable capacitance block 750, that is used in place of the capacitor C3 of the slave oscillator 120 shown in FIG. 3B, according to still another embodiment of the invention.

The capacitance block 750 comprises a decoder 760 connected to an input bus 790 of N input lines as configuration data, the output thereof providing an output bus 780 of $2^N$ control lines. The capacitance block 750 also comprises a plurality of capacitive units, 770A . . . 770N, each inserted between the third node X3 of the slave oscillator 120 and ground GND. The third node X3 is also connected to ground GND through the sixth switch SW32. In particular, each capacitive unit 770 comprises a first enabling transistor M73 and a capacitor C7, inserted, in series to each other, between the third node X3 and ground GND, the enabling transistor M73 having a control or gate terminal connected to one control line of the output bus 780.

The capacitor C7 of each capacitive unit 770 is able to store a charge being derived by a current flowing through the capacitive unit itself, while the enabling switch M73 is a configuration switch able to switch on or off the current flowing through the capacitive unit 770 according to the data provided by the respective control line of the output bus 780.

In this way, the capacitance value of the configurable capacitance block 750 can be adjusted.

Also in this case, in order to obtain a proper time shift, another configurable capacitance block 750 with a second plurality of capacitive units should be applied also to the fourth node X4 of the slave oscillator 120.

In essence, the configurable capacitance block 750 allows a selection of the time shift between the master and slave clock signals by changing the charging capacitance value and thus the current provided to the slave oscillator 120.

The clock generator according to the embodiments of the present disclosure allows to generate two or more digital clock signals with a precise time shift between them. These clock signals are thus suitable for integrated circuits where an accurate device matching is commonly obtained.

The described clock generator is also suitable to obtain a high precision high frequency digital clock signal.

In this way, changing the period of the generated clock signals is easily obtained as well as different clock signals with a precise time difference between them.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed:

1. A device comprising:
   a first terminal for a first clock signal;
   a second terminal for a second clock signal that is substantially complementary to the first clock signal;
   a third terminal for a third clock signal;
   a fourth terminal for a fourth clock signal that is substantially complementary to the third clock signal;
   a first logic gate performing a first logic operation on the first and third clock signals to produce a first intermediate signal;
   a second logic gate performing a second logic operation on the second and fourth clock signals to produce a second intermediate signal;
   a first delay circuit delaying the first intermediate signal to produce a third intermediate signal;
   a second delay circuit delaying the second intermediate signal to produce a fourth intermediate signal; and
   a first output circuit coupled to the first and second delay circuits to produce the third and fourth clock signals respectively at the third and fourth terminals.

2. The device according to claim 1, further comprising:
   a third delay circuit delaying the first clock signal to produce a fifth intermediate signal;
   a fourth delay circuit delaying the second clock signal to produce a sixth intermediate signal; and
   a second output circuit coupled to the third and fourth delay circuits to produce the first and second clock signals respectively at the first and second terminals.

3. The device according to claim 1, wherein the first output circuit comprises an SR flip-flop circuit including a set node, a reset node, a true output node and a complementary output node, the set and reset nodes being supplied respectively with the third and fourth intermediate signals, and the true and complementary output nodes being coupled respectively to the fourth and third terminals.

4. The device according to claim 1, wherein the first and second logic gates comprises an OR gate.

5. The device according to claim 1, wherein each of the first and second delay circuits presents signal delay time that is greater than a half of one cycle period of first clock signal.

6. The device according to claim 2, wherein each of the first and second delay circuits presents signal delay time that is greater than a half of one cycle period of the first clock signal and each of the third and fourth delay circuits presents a signal delay time that is substantially equal to a half of one cycle period of the first clock signal.

7. The device according to claim 2, wherein each of the first and second output circuit comprises a set node, a reset node, a true output node and a complementary output node to serve as an SR flip-flop circuit, the set nodes of the first and second output circuits being supplied respectively with the third and fifth intermediate signals, the reset nodes of the first and second output circuits being supplied respectively with the fourth and sixth intermediate signals, the true output nodes of the first and second output circuits being coupled respectively to the fourth and second terminals, and the complementary output nodes of the first and second output circuits being coupled respectively to the third and first terminals.

8. The device according to claim 2, wherein each of the first and second logic gates comprises an OR gate.

9. The device according to claim 1, further comprising:
   a first slave logic circuit including the first logic gate and the second logic gate;
   a first sub-circuit including the first delay circuit, the second delay circuit, and the first output circuit;
   and wherein the first slave sub-circuit producing the third clock signal that is substantially equal in frequency to the first clock signal and that differs in phase from the first clock signal by a first value that is smaller than a half of one cycle period of the first clock signal.

10. The device according to claim 9, further comprising:
    a master sub-circuit generating the first clock signal at the first terminal and the second clock signal at the second terminal, the first clock signal being substantially complementary to the second clock signal.

11. The device according to claim 9, further comprising
a second slave logic circuit including a third logic gate receiving the first clock signal and a fifth clock signal, and including a fourth logic gate receiving the second clock signal and a sixth clock signal;
a second sub-circuit producing the fifth clock signal and the sixth clock signal, the fifth clock signal being substantially complementary to the sixth clock signal, the first and fifth clock signals being substantially equal in frequency to each other and differing in phase from each other by a second value that is smaller than a half of one cycle period of the first clock signal.

12. The device according to claim 11, wherein the first value is different from the second value.

13. The device according to claim 9, further comprising
a second slave logic circuit including a third logic gate receiving the third clock signal and a fifth clock signal, and including a fourth logic gate receiving the fourth clock signal and a sixth clock signal;
a second sub-circuit producing the fifth clock signal and the sixth clock signal, the fifth clock signal being substantially complementary to the sixth clock signal, the first and fifth clock signals being substantially equal in frequency to each other and differing in phase from each other by a second value that is smaller than a half of one cycle period of the first clock signal.

14. The device according to claim 13, wherein the first value is different from the second value.

15. The device according to claim 1, further comprising:
a control unit;
a memory unit;
a bus interconnecting the memory unit and memory unit to each other;
the first terminal coupled to the control unit and the memory unit to convey the first clock signal, the control unit accessing to the memory unit through the bus in response to the first clock signal;
the third terminal coupled to the memory unit to convey the third clock signal, the memory unit supplying data to the control unit through the bus in response to the second clock signal.

16. The device according to claim 15, further comprising:
a first clock generator generating the first clock signal to be supplied to the first terminal.

17. The device according to claim 16, wherein the first clock generator comprising:
a third delay circuit delaying the first clock signal to produce a fifth intermediate signal;
a fourth delay circuit delaying a second clock signal to produce a sixth intermediate signal; and
a second output circuit coupled to the third and fourth delay circuits to receive the fifth and sixth intermediate signals and to produce the first and second clock signals respectively.

18. The device according to claim 17, wherein each of the third and fourth delay circuit presents delay time that is substantially equal to a half of one cycle period of the first clock signal, and wherein each of the first and second delay circuits presents delay time that is substantially equal to a sum of the first value and a half of one cycle period of the first clock signal.

19. The device according to claim 1, wherein each of the first and second delay circuits has delay time that is variable in response to configuration data.

20. The device according to claim 1, wherein each of the first and second delay circuits comprises a capacitor and a charging/discharging circuit supplying a charging/discharging current to the capacitor, a capacitance value of the capacitor and the charging/discharging current of the charging/discharging circuit being configured to be varied in response to configuration data.

21. The device according to claim 1, further comprising:
a fifth terminal for a fifth clock signal;
a sixth terminal for a sixth clock signal that is substantially complementary to the fifth clock signal;
a third logic gate performing the first logic operation on the first and fifth clock signals to produce a fifth intermediate signal;
a fourth logic gate performing the second logic operation on the second and sixth clock signals to produce a sixth intermediate signal;
a third delay circuit delaying the fifth intermediate signal to produce a seventh intermediate signal;
a fourth delay circuit delaying the sixth intermediate signal to produce an eighth intermediate signal; and
a second output circuit coupled to the third and fourth delay circuits to receive the seventh and eight intermediate signals and to produce the fifth and sixth clock signals respectively at the fifth and sixth terminals.

22. The device according to claim 1, further comprising:
a fifth terminal for a fifth clock signal;
a sixth terminal for a sixth clock signal that is substantially complementary to the fifth clock signal;
a third logic gate performing the first logic operation on the third and fifth clock signals to produce a fifth intermediate signal;
a fourth logic gate performing the second logic operation on the fourth and sixth clock signals to produce a sixth intermediate signal;
a third delay circuit delaying the fifth intermediate signal to produce a seventh intermediate signal;
a fourth delay circuit delaying the sixth intermediate signal to produce an eighth intermediate signal; and
a second output circuit coupled to the third and fourth delay circuits to receive the seventh and eight intermediate signals and to produce the fifth and sixth clock signals respectively at the fifth and sixth terminals.

* * * * *